US008749071B2

(12) United States Patent
Park et al.

(10) Patent No.: US 8,749,071 B2

(45) Date of Patent: Jun. 10, 2014

(54) SEMICONDUCTOR DEVICES AND THE METHOD OF MANUFACTURING THE SAME

(71) Applicant: Samsung Electronics Co., Ltd., Suwon-si (KR)

(72) Inventors: Dong-Sik Park, Suwon-si (KR); Sungjin Kim, Hwaseong-si (KR); Seungmo Kang, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/908,220

(22) Filed: Jun. 3, 2013

(65) Prior Publication Data

US 2014/0015137 A1 Jan. 16, 2014

(30) Foreign Application Priority Data

Jul. 11, 2012 (KR) ........................ 10-2012-0075594

(51) Int. Cl.
*H01L 29/45* (2006.01)
*H01L 23/48* (2006.01)

(52) U.S. Cl.
USPC ............. 257/775; 257/E29.139; 257/E23.011

(58) Field of Classification Search
None
See application file for complete search history.

(56) References Cited

U.S. PATENT DOCUMENTS 7,205,233 B2 * 4/2007 Lopatin et al. ................ 438/678
7,279,411 B2 10/2007 Agarwala et al.
7,569,475 B2 8/2009 Yang et al.
7,670,924 B2 * 3/2010 Demos et al. ................. 438/421
7,928,003 B2 * 4/2011 Naik ............................ 438/626
7,951,713 B2 5/2011 Kim
8,357,605 B2 * 1/2013 Lee et al. ...................... 438/592
8,431,486 B2 * 4/2013 Cabral et al. .................. 438/673
2005/0200023 A1 * 9/2005 Lin .............................. 257/758
2007/0096322 A1 * 5/2007 Asai et al. ..................... 257/758
2008/0048326 A1 2/2008 Han
2009/0087977 A1 * 4/2009 Spuller et al. ................. 438/593
2010/0014214 A1 1/2010 Yamazaki et al.
2010/0032845 A1 * 2/2010 Usami ........................... 257/773
2012/0261828 A1 * 10/2012 Bruce et al. ................... 257/774
2013/0228934 A1 * 9/2013 Kim et al. ..................... 257/774

FOREIGN PATENT DOCUMENTS

| | | |
|---|---|---|
| JP | 10-172971 | 6/1998 |
| KR | 100223759 | 7/1999 |
| KR | 1020010058941 | 7/2001 |
| KR | 100464186 | 12/2004 |

* cited by examiner

*Primary Examiner* — Thomas L Dickey
*Assistant Examiner* — Joseph Schoenholtz
(74) *Attorney, Agent, or Firm* — F. Chau & Associates, LLC

(57) ABSTRACT

A semiconductor device may include a first interlayer dielectric layer including a plurality of contacts, a plurality of interconnection patterns disposed on the first interlayer dielectric layer and connected to the contacts, respectively, and a second interlayer dielectric layer disposed on the first interlayer dielectric layer and covering the interconnection patterns. Each of the interconnection patterns may include a first metal pattern, a second metal pattern disposed on the first metal pattern, a first barrier pattern between the contact and the first metal pattern, and a second barrier pattern between the first metal pattern and the second metal pattern. The second metal pattern may expose a portion of a top surface of the second barrier pattern, and the second interlayer dielectric layer may include an air gap between the interconnection patterns adjacent to each other.

15 Claims, 5 Drawing Sheets

SEMICONDUCTOR DEVICES AND THE METHOD OF MANUFACTURING THE SAME

CROSS-REFERENCE TO RELATED APPLICATIONS

This application claims priority under 35 U.S.C. §119 to Korean Patent Application No. 10-2012-0075594, filed on Jul. 11, 2012, the disclosure of which is hereby incorporated by reference herein in its entirety.

(i) Technical Field

The present disclosure relates to semiconductor devices and the method of manufacturing the same and, more particularly, to semiconductor devices including interconnection patterns and the method of manufacturing the same.

(ii) Discussion of the Related Art

Semiconductor devices are widely used in the electronics industry because of their small size, multi-function, and/or the manufacturing costs associated therewith. The semiconductor devices may be categorized, for example, as any one of semiconductor memory devices storing logic data, semiconductor logic devices processing operations of logical data, and system on chips having both the function of the semiconductor memory devices and the function of the semiconductor logic devices.

High speed and/or low voltage semiconductor devices have been desired for providing high speed and low power consumption of electronic products. The semiconductor devices have been more highly integrated to meet the above requests. As the semiconductor devices become highly integrated, the reliability of the semiconductor devices may be deteriorated. However, high reliability semiconductor devices have been increasingly requested with the development of the electronics industry. Thus, various research has been conducted for increasing the reliability of the semiconductor devices.

SUMMARY

Embodiments of the inventive concept may provide semiconductor devices with high reliability.

In an exemplary embodiment of the inventive concept, a semiconductor device is provided. The semiconductor device may include: a first interlayer dielectric layer including a plurality of contacts, a plurality of interconnection patterns disposed on the first interlayer dielectric layer, the interconnection patterns connected to the contacts, respectively, and a second interlayer dielectric layer disposed on the first interlayer dielectric layer and covering the interconnection patterns. Each of the interconnection patterns may include: a first metal pattern, a second metal pattern disposed on the first metal pattern, a first barrier pattern between the contact and the first metal pattern and a second barrier pattern between the first metal pattern and the second metal pattern. The second metal pattern may expose a portion of a top surface of the second barrier pattern, and the second interlayer dielectric layer may include an air gap between the interconnection patterns adjacent to each other.

In an embodiment, an edge portion of the second barrier pattern may laterally protrude from a sidewall of the second metal pattern, so that a sidewall of each of the interconnection patterns has a stepped profile.

In an embodiment, a ratio of a sum of thicknesses of the first and second metal patterns to a thickness of the second barrier pattern may be within a range of about 50:1 to about 700:1. A thickness of the second barrier pattern may be within a range of about 10 Å to about 100 Å.

In an embodiment, the second bather pattern is formed of a titanium-aluminum (Ti—Al) compound.

In an embodiment, the air gap may have a pipe-shape extending in parallel to the interconnection patterns. A width of the air gap may be within a range of about 60% to about 90% of a distance between bottom surfaces of the interconnection patterns adjacent to each other.

In an embodiment, each of the interconnection patterns may further include an anti-reflecting pattern disposed on the second metal pattern.

In an embodiment, a semiconductor device may include: a first interlayer dielectric layer including a plurality of contacts and a plurality of interconnection patterns disposed on the first interlayer dielectric layer and connected to the contacts, respectively. Each of the interconnection patterns may include: a first metal pattern, a second metal pattern disposed on the first metal pattern, a first barrier pattern between the contact and the first metal pattern and a second barrier pattern between the first metal pattern and the second metal pattern. A sidewall of the first metal pattern may have a smaller gradient than a gradient of a sidewall of the second metal pattern.

In an exemplary embodiment of the inventive concept, a method for manufacturing a semiconductor package is provided. The method may include forming a first interlayer dielectric layer on a substrate, forming a plurality of contacts penetrating the first dielectric layer and the contacts are laterally spaced apart from each other, sequentially forming a first barrier layer including titanium, a first metal layer including aluminum, a second barrier layer including titanium and a second metal layer including aluminum on the first interlayer dielectric layer, performing a thermal treating process on the second metal layer, the second barrier layer, the first metal layer and the first barrier layer such that the titanium in the second barrier layer is combined with the aluminum in the first and second metal layers, thereby converting the second barrier layer into a thermally treated second barrier layer including a titanium-aluminum (Ti—Al) compound layer and such that a portion of the titanium in the first barrier layer is combined with the aluminum in the first metal layer thereby converting the first barrier layer into a thermally treated first barrier layer including a titanium (Ti) layer and a titanium-aluminum (Ti—Al) compound layer.

The method may further include patterning the second metal layer, the thermally treated second barrier layer, the first metal layer, and the thermally treated first barrier layer to thereby form a plurality of interconnection patterns on the first interlayer dielectric layer and connected to the contacts. Each of the interconnection patterns includes a first barrier pattern, a first metal pattern, a second barrier pattern, and a second metal pattern which are sequentially stacked, and the second metal pattern exposes a portion of a top surface of the second barrier pattern, and forming a second interlayer dielectric layer on the first interlayer dielectric layer covering sidewalls and top surfaces of the interconnection patterns. The second interlayer dielectric layer includes an air gap between the interconnection patterns adjacent to each other.

BRIEF DESCRIPTION OF THE DRAWINGS

Exemplary embodiments of the inventive concept can be understood in more detail from the following detailed description taken in conjunction with the attached drawings in which.

DETAILED DESCRIPTION OF EXEMPLARY EMBODIMENTS

Figure 1:
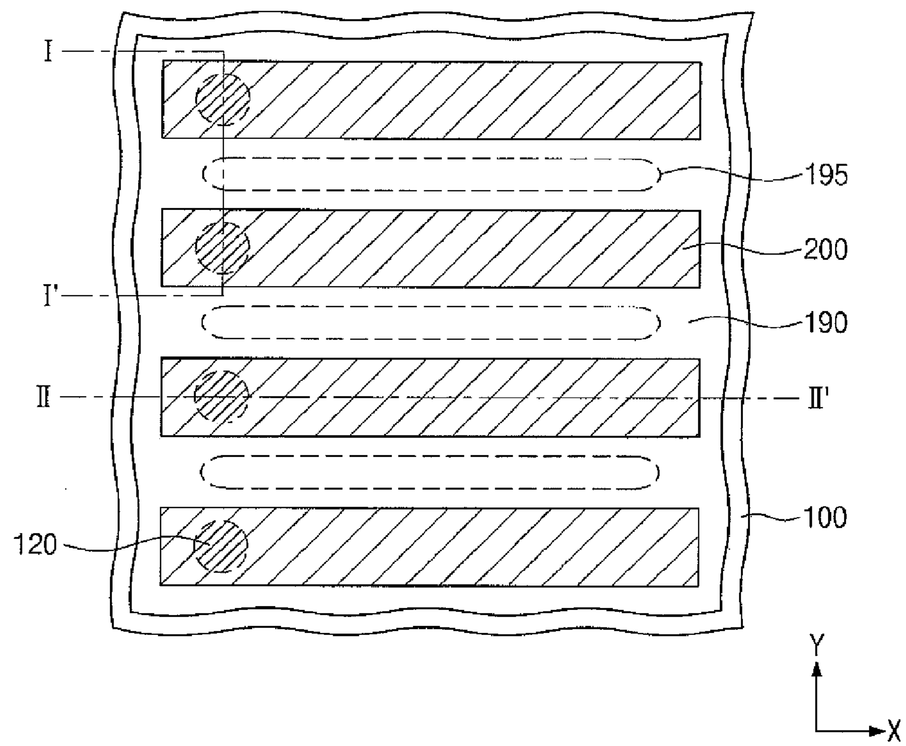
FIG. 1 is a plan view illustrating a semiconductor device according to an exemplary embodiment of the inventive concept.

The terminology used herein is for the purpose of describing particular embodiments only and is not intended to limit exemplary embodiments of the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The same reference numerals or the same reference designators denote the same elements throughout the specification.

Figure 2:
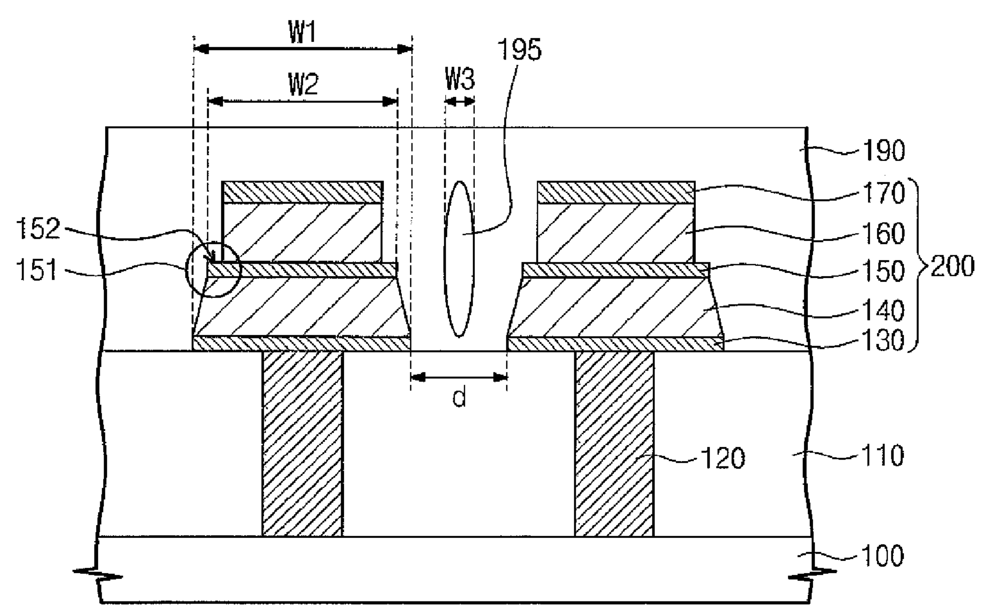
FIG. 2 is a cross-sectional view taken along a line I-I' of FIG. 1.

FIG. 1 is a plan view illustrating a semiconductor device according to an exemplary embodiment of the inventive concept. FIG. 2 is a cross-sectional view taken along a line I-I' of FIG. 1, and FIG. 3 is a cross-sectional view taken along a line II-II' of FIG. 1.

Figure 3:
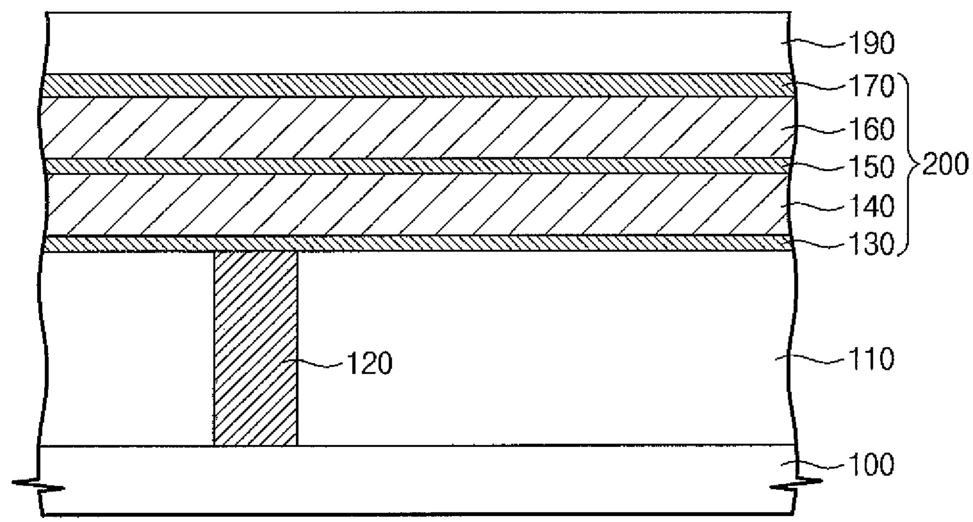
FIG. 3 is a cross-sectional view taken along a line II-II' of FIG. 1.

Referring to FIGS. 1, 2, and 3, a first interlayer dielectric layer 110 may be disposed on a substrate 100. The substrate 100 may be a semiconductor substrate such as, for example, a silicon substrate, a germanium substrate, or a silicon-germanium substrate. The substrate 100 may include, for example, a plurality of transistors and/or conductive patterns. The first interlayer dielectric layer 110 may be single-layered or multi-layered. For example, the first interlayer dielectric layer 110 may include an oxide layer (e.g., a silicon oxide layer), a nitride layer (e.g., a silicon nitride layer), and/or an oxynitride layer (e.g., a silicon oxynitride layer).

A plurality of contacts 120 may be formed in the first interlayer dielectric layer 110. The contacts 120 may, for example, penetrate the first interlayer dielectric layer 110. The contacts 120 may be, for example, laterally spaced apart from each other. For example, the contacts 120 may be arranged in a Y-axis direction to constitute one row as illustrated in FIG. 1. The contacts 120 may include, for example, a conductive material. For example, the contacts 120 may include at least one of doped semiconductor (e.g., doped silicon), a metal (e.g., tungsten), a conductive metal nitride (e.g., titanium nitride, tantalum nitride, and/or tungsten nitride), a transition metal (e.g., titanium, tantalum), and a conductive metal-semiconductor compound (e.g., metal silicide). The contacts 120 may be connected to the conductive patterns included in the substrate 100 or may be electrically connected to the transistors included in the substrate 100.

Interconnection patterns 200 may be disposed on the first interlayer dielectric layer 110. The interconnection patterns 200 may, for example, extend in an X-axis direction in a plan view as illustrated in FIG. 1. The interconnection patterns 200 may be, for example, spaced apart from each other in the Y-axis direction. The X-axis and Y-axis direction may be, for example, parallel to a top surface of the substrate 100. The X-axis and Y-axis direction may, for example, cross each other. Bottom surfaces of the interconnection patterns 200 may be, for example, connected to the contacts 120, respectively.

Each of the interconnection patterns 200 may include, for example, a first metal pattern 140, a second metal pattern 160 on the first metal pattern 140, a first barrier pattern 130 between the contact 120 and the first metal pattern 140, a second barrier pattern 150 between the first and second metal patterns 140 and 160, and an anti-reflecting pattern 170 on the second metal pattern 160.

The first metal pattern 140 and the second metal pattern 160 may include, for example, aluminum (Al). A sum of a thickness of the first metal pattern 140 and a thickness of the second metal pattern 160 may be, for example, within a range of about 5000 Å to about 7000 Å. The first barrier pattern 130 may include, for example, titanium (Ti) and a titanium-aluminum (Ti—Al) compound. For example, the first barrier pattern 130 may include a titanium (Ti) layer and a Ti—Al compound layer on the titanium (Ti) layer. The Ti—Al compound may be, for example, $TiAl_3$. For example, the first barrier pattern 130 may have a thickness within a range of about 10 Å to about 100 Å. The second barrier layer 150 may include, for example, a Ti—Al compound. For example, the second barrier pattern 150 may have a thickness within a range of about 10 Å to about 100 Å. A ratio of the sum of the thicknesses of the first and second metal patterns 140 and 160 to the thickness of the second barrier pattern 150 may have, for example, a range of about 50:1 to about 700:1. The anti-reflecting pattern 170 may include, for example, titanium nitride (TiN). The anti-reflecting pattern 170 may prevent irregular reflection of light in a lithography process.

Hereinafter, the first and second barrier patterns 130 and 150 will be described in more detail.

The titanium (Ti) layer in the first barrier pattern 130 may capture hydrogen ions (H+) which may be diffused to an interface between the substrate 100 and a gate insulating layer along the interconnection patterns 200 and/or the contacts 120 in subsequent processes after the formation of the first and second barrier patterns 130 and 150. The hydrogen ions (H+) may be combined with fluorine ions (F−) within the gate insulating layer, and the combined hydrogen ions (H+) and the fluorine ions (F−) may be diffused to the interface. As the thickness of the first barrier pattern 130 increases, the amount (e.g., a thickness) of the titanium (Ti) layer in the first barrier pattern 130 may increase to increase the amount of hydrogen ions (H+) captured by the titanium (Ti) layer in the first barrier pattern 130. Thus, the amount of hydrogen ions (H+) diffused to the interface can be reduced. Additionally, the amount of fluorine ions (F−) diffused to the interface can be reduced. As the amount of fluorine ions (F−) in the interface is reduced, a capacitance equivalent thickness (CET) of the gate insulating layer may be reduced. Thus, the amount of a leakage current may increase in the state that a transistor is turned-off (e.g., a static refresh fail increases).

Additionally, the titanium (Ti) layer in the first barrier pattern 130 may increase a contact resistance between the contact 120 and the first barrier pattern 130 (i.e. the interconnection pattern). Thus, as the thickness of the first barrier pattern 130 increases, the amount of the titanium (Ti) layer in the first barrier pattern 130 may increase to increase the contact resistance.

The Ti—Al compound may inhibit grain growth of the first and second metal patterns 140 and 160 caused according to a temperature variation. If the grain growth of the first and second metal patterns 140 and 160 increases in a subsequent thermal treating process, the interconnection patterns 200 may be broken by, for example, a stress migration phenomenon.

As described above, the thickness of the first barrier pattern 130 may be within the range of, for example, about 10 Å to about 100 Å, so that the amount of the titanium (Ti) layer in the first barrier pattern 130 may be reduced to reduce the amount of the hydrogen ions (H+) captured by the titanium (Ti) layer. As a result, it is possible to increase the amount of the fluorine ions (F−) combined with the hydrogen ions (H+) and then diffused to the interface. As the amount of the fluorine ions (F−) increases in the interface, the CET of the gate insulating layer may increase to reduce the leakage current in the state that the transistor is turned-off. Additionally, as the amount of the titanium (Ti) layer is reduced in the first barrier pattern 130, the contact resistance between the contact 120 and the interconnection pattern 200 may be reduced. If the thickness of the first barrier pattern 130 is greater than about 100 Å, the amount of the titanium (Ti) layer in the first barrier pattern 130 may increase, so that the leakage current may increase and the resistance of the contact 120 may increase.

As described above, the first and second barrier patterns 130 and 150 may include, for example, the Ti—Al compound. The Ti—Al compound in the first and second barrier patterns 130 and 150 may reduce the stress migration phenomenon. In other words, the Ti—Al compound may inhibit the grain growth of the first and second metal patterns 140 and 160. As a result, it is possible to prevent or minimize the metal migration phenomenon of the interconnection patterns 200 in a subsequent thermal treating process. As described above, each of the first and second barrier patterns 130 and 150 may have a thickness, for example, within the range of about 10 Å to about 100 Å. If the thickness of each of the first and second barrier patterns 130 and 150 is lower than about 10 Å, the amount of the Ti—Al compound may be reduced in the first and second barrier patterns 130 and 150 to cause the metal migration phenomenon.

As a result, with exemplary embodiments of the inventive concept, it is possible to realize a semiconductor device having excellent reliability.

Referring to FIGS. 1, 2, and 3, a sidewall of the interconnection pattern 200 may have, for example, a stepped profile 151 due to the second barrier pattern 150 and the second metal pattern 160. For example, the second metal pattern 160 may expose a portion 152 (e.g., an edge) of a top surface of the second barrier pattern 150. The stepped profile 151 may include, for example, the portion 152 of the top surface of the second barrier pattern 150 which is exposed by the second metal pattern 160. The stepped profile 151 may be formed, for example, at both sidewalls of the interconnection pattern 200. In other words, as illustrated in FIG. 2, a width of a bottom surface of the second metal pattern 160 may be, for example, smaller than a width of the top surface of the second barrier pattern 150. In an embodiment, the second metal pattern 160 may be disposed, for example, on a center region of the top surface of the second barrier pattern 150, so that an edge portion of the second barrier pattern 150 may laterally protrude from the sidewall of the second metal pattern 160. Thus, the stepped profile 151 may be defined. An edge of the top surface of the second barrier pattern 150, which is not covered by the second metal pattern 160, may correspond to the portion 152 of the stepped profile 151.

A sidewall of the first metal pattern 140 may have, for example, a gradient less than a gradient of the sidewall of the second metal pattern 160. For example, the sidewall of the first metal pattern 140 may have the gradient within a range of about 70 degrees to about 85 degrees. Additionally, a width W1 of the first barrier pattern 130 may be, for example, greater than a width W2 of the second barrier pattern 150.

A second interlayer dielectric layer 190 may be provided on the first interlayer dielectric layer 110. The second interlayer dielectric layer 190 may, for example, cover sidewalls and top surfaces of the interconnection patterns 200. The second interlayer dielectric layer 190 may be single-layered or multi-layered. For example, the second interlayer dielectric layer 190 may include an oxide (e.g., silicon oxide). The second interlayer dielectric layer 190 may include, for example, air gaps 195 formed between the interconnection patterns 200. For example, each of the air gaps 195 may be formed between the interconnection patterns 200 adjacent to each other. The air gaps 195 may be, for example, surrounded by the second interlayer dielectric layer 190. The air gaps 195 may extend, for example, in parallel to the interconnection patterns 200. For example, the air gaps 195 may have pipe-shapes extending in parallel to the interconnection patterns 200. A width W3 of the air gap 195 may be, for example, within a range of about 60% to about 90% of a distance d between the bottom surfaces of the interconnection patterns 200 adjacent to each other.

The air gaps 195 may reduce signal delay between the interconnection patterns 200 adjacent to each other. In the semiconductor device according to embodiments of the inventive concept, the air gaps 195 may be readily formed by the sidewall profiles of the interconnection patterns 200. Thus, it is possible to minimize the signal delay between the interconnection patterns 200 adjacent to each other. As a result, a semiconductor device with excellent reliability may be realized.

Hereinafter, a method of manufacturing a semiconductor device according to exemplary embodiments will be described with reference to the drawings.

FIGS. 4 to 8 are cross-sectional views taken along a line I-I' of FIG. 1 to explain a method of manufacturing a semiconductor package according to exemplary embodiments of the inventive concept.

Figure 4:
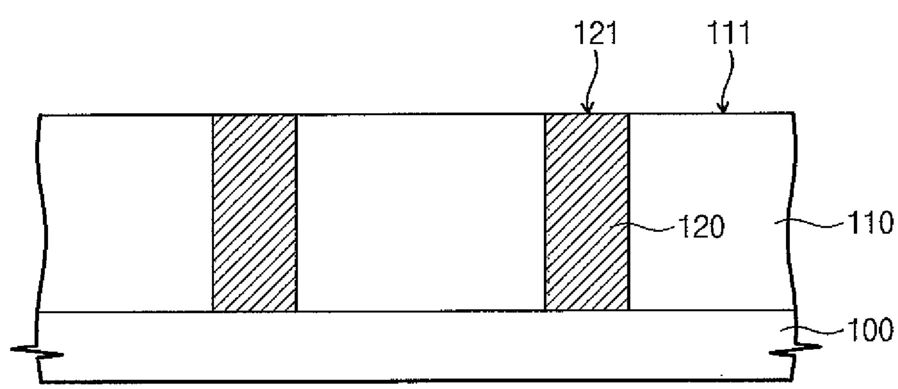
FIGS. 4 to 8 are cross-sectional views taken along a line I-I' of FIG. 1 to explain a method of manufacturing a semiconductor package according to an exemplary embodiment of the inventive concept.

Referring to FIGS. 1 and 4, a first interlayer dielectric layer 110 may be formed on a substrate 100, and then contacts 120 may be formed in the first interlayer dielectric layer 110. A plurality of transistors and/or a plurality of conductive patterns may be formed in the substrate 100. The first interlayer dielectric layer 110 may be formed by, for example, a deposition process. For example, the first interlayer dielectric layer 110 may be formed by a plasma enhanced tetra-ethyl-ortho-silicate (PETEOS) process. The contacts 120 may, for example, penetrate the first interlayer dielectric layer 120 and be laterally spaced apart from each other. For example, the contacts 120 may be arranged in the Y-axis direction to constitute one row as illustrated in FIG. 1. Top surfaces 121 of the contacts 120 may be, for example, substantially coplanar with a top surface 111 of the first interlayer dielectric layer 110.

Figure 5:
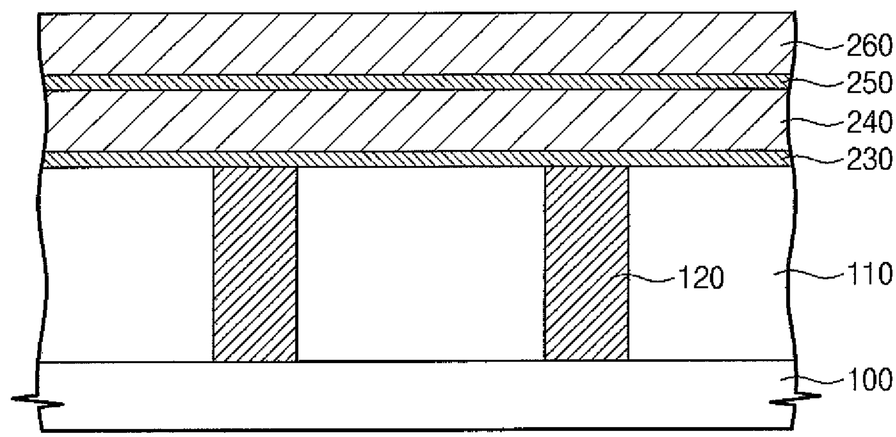

Referring to FIG. 5, a first barrier layer 230, a first metal layer 240, a second barrier layer 250, and a second metal layer 260 may be sequentially formed on the first interlayer dielectric layer 110 and the contacts 120. For example, each of the first barrier layer 230, the first metal layer 240, the second barrier layer 250, and the second metal layer 260 may be formed by a physical vapor deposition (PVD) process. For example, each of the first and second barrier layers 230 and 250 may include titanium (Ti), titanium nitride (TiN), or titanium/titanium nitride (Ti/TiN). For example, each of the first and second metal layers 240 and 260 may include aluminum (Al).

Figure 6:
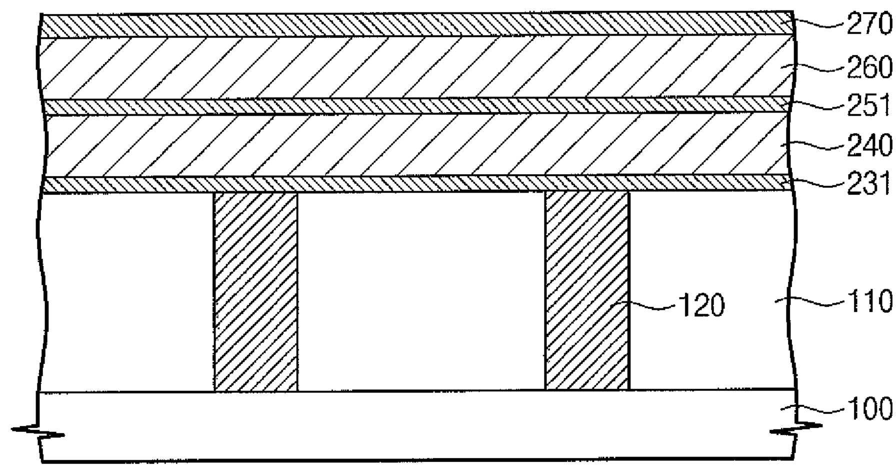

For example, referring to FIG. 6, a thermal treating process may be performed after the second metal layer 260 is formed. The thermal treating process may be performed at, for example, a temperature of about 300 degrees Celsius (° C.) to about 600 degrees Celsius (° C.).

For example, titanium (Ti) in the second barrier layer 250 may be combined with aluminum (Al) in the first and second metal layers 240 and 260 to form a Ti—Al compound (e.g., $TiAl_x$, 'x' denotes an integer). In other words, the second barrier layer 250 may be converted into the thermally treated second barrier layer 251 including a Ti—Al compound layer by the thermal treating process. In an embodiment, the second barrier layer 250 may be, for example, fully converted into the Ti—Al compound layer. A portion of titanium (Ti) in the first barrier layer 230 may be, for example, combined with aluminum (Al) in the first metal layer 240 to form a Ti—Al compound (e.g., $TiAl_x$, 'x' denotes an integer) by the thermal treating process. In other words, it is possible to form the thermally treated first barrier layer 231 including a titanium (Ti) layer and the Ti—Al compound layer.

After the thermal treating process, an anti-reflecting layer 270 may be formed. The anti-reflecting layer 270 may be formed by, for example, a PVD process. For example, the anti-reflecting layer 270 may include titanium nitride (TiN).

Figure 7:
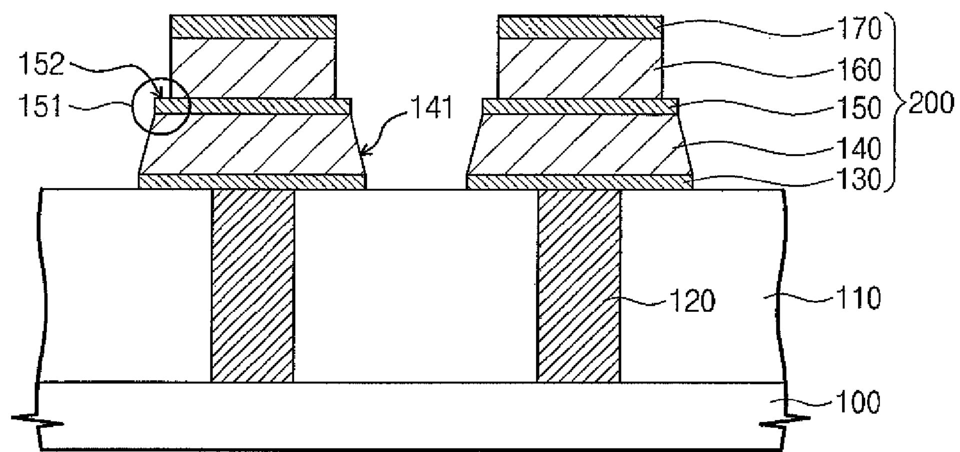

Referring to FIG. 7, the anti-reflecting layer 270, the second metal layer 260, the thermally treated second barrier layer 251, the first metal layer 240, and the thermally treated first barrier layer 231 may be, for example, successively patterned to form interconnection patterns 200. Each of the interconnection patterns 200 may include, for example, a first barrier pattern 130, a first metal pattern 140, a second barrier pattern 150, a second metal pattern 160, and an anti-reflecting pattern 170 which are sequentially stacked.

In an embodiment, the interconnection patterns 200 may be formed using, for example, a dry etching process. Etch-rates of the first and second metal layers 240 and 260 may be, for example, different from etch-rates of the thermally treated barrier layers 231 and 251 in the dry etching process. Thus, a portion 152 of a top surface of the second barrier pattern 150 may be, for example, exposed to form a stepped profile 151 at a sidewall of the interconnection pattern 200 during the dry etching process. A slope of a sidewall 141 of the first metal pattern 140 may be, for example, smaller than a slope of a sidewall of the second metal pattern 160. The difference between the slopes of the sidewalls of the first and second metal patterns 140 and 160 may be realized by, for example, various etching methods. In an embodiment, the amount of etch-byproducts generated during the formation of the first metal pattern 140 may be, for example, greater than the amount of etch-byproducts generated during the formation of the second metal pattern 160. Thus, the slope of the sidewall 141 of the first metal pattern 140 may be, for example, smaller than the slope of the sidewall of the second metal pattern 160. In an embodiment, the formation of the first metal pattern 140 and the formation of the second metal pattern 160 may be performed using, for example, etch-recipes different from each other, respectively.

Bottom surfaces of the interconnection patterns 200 may be, for example, connected to the contacts 120, respectively.

Figure 8:
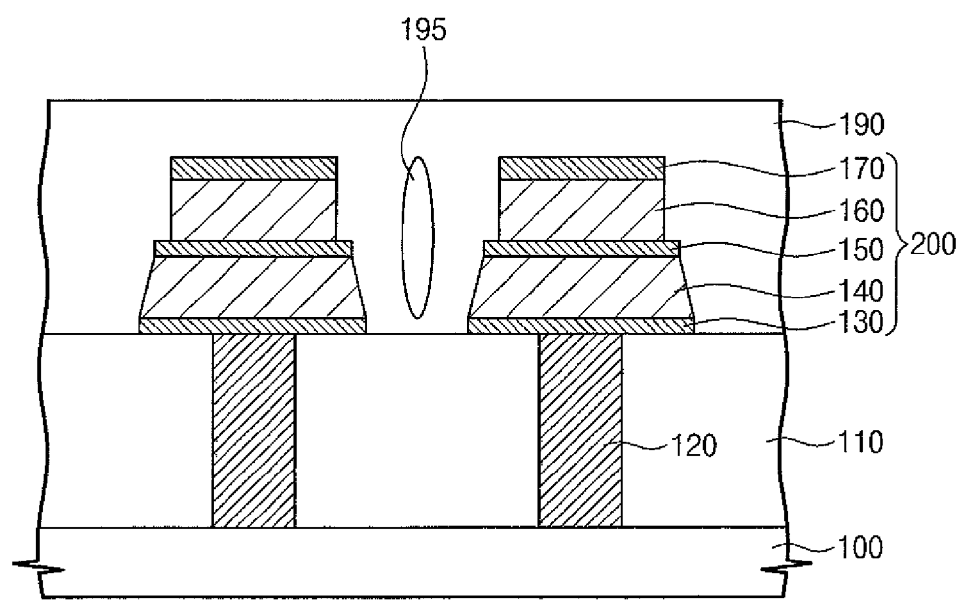

Referring to FIG. 8, a second interlayer dielectric layer 190 may be formed on the first interlayer dielectric layer 110 to, for example, cover sidewalls and top surfaces of the interconnection patterns 200. The second interlayer dielectric layer 190 may be formed by, for example, a deposition process. For example, the second interlayer dielectric layer 190 may be formed by a high density plasma (HDP) process. A distance between bottom surfaces of the interconnection patterns 200 adjacent to each other may be, for example, narrow due to the sidewall structures of the interconnection patterns 200. It may be difficult to fill a space between the interconnection patterns 200 with the second interlayer dielectric layer 190 due to the narrow distance between the bottom surfaces of the interconnection patterns 200. Thus, air gaps 195 may be readily formed between the interconnection patterns 200. A signal delay between the interconnection patterns 200 may be minimized by the air gaps 195, so that a semiconductor device with excellent reliability may be realized.

Figure 9:
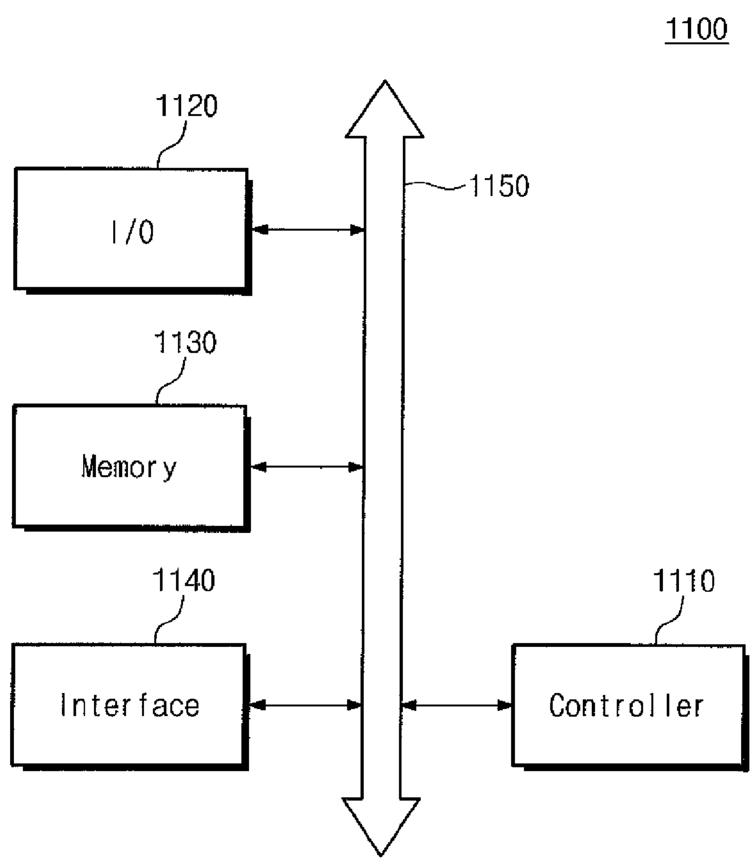
FIG. 9 is a schematic block diagram illustrating an example of electronic systems including semiconductor devices according to an exemplary embodiment of the inventive concept.

FIG. 9 is a schematic block diagram illustrating an example of electronic systems including semiconductor devices according to exemplary embodiments of the inventive concept.

Referring to FIG. 9, an electronic system 1100 according to an embodiment may include, for example, a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through, for example, the data bus 1150. The data bus 1150 may correspond to a path through which electrical signals are transmitted.

The controller 1110 may include, for example, at least one of a microprocessor, a digital signal processor, a microcontroller or other logic devices. The other logic devices may have a similar function to any one of the microprocessor, the digital signal processor and the microcontroller. The I/O unit 1120 may include, for example, a keypad, a keyboard and/or a display unit. The memory device 1130 may store data and/or commands. The memory device 1130 may include, for example, at least one of the semiconductor devices according to embodiments described above. The memory device 1130 may further include, for example, other types of semiconductor memory devices which are different from the semiconductor devices described above. The interface unit 1140 may transmit electrical data to a communication network or may receive electrical data from a communication network.

The electronic system 1100 may be applied to, for example, a personal digital assistant (PDA), a portable computer, a web tablet, a wireless phone, a mobile phone, a digital music player, a memory card or other electronic products.

Figure 10:
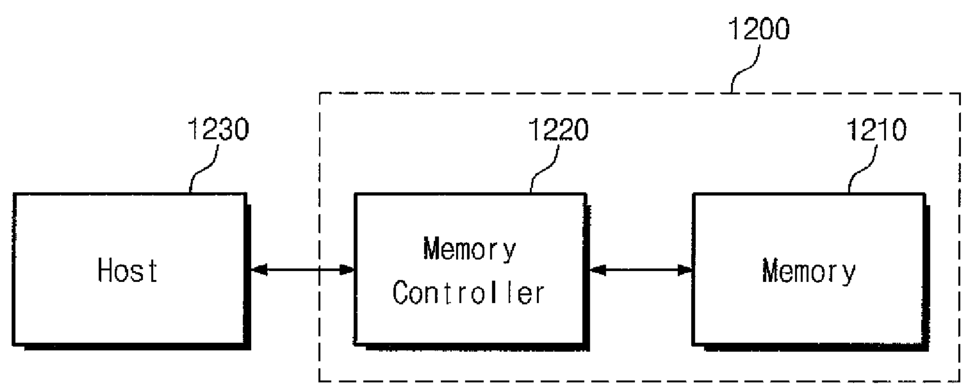
FIG. 10 is a schematic block diagram illustrating an example of memory cards including semiconductor devices according to an exemplary embodiment of the inventive concept.

FIG. 10 is a schematic block diagram illustrating an example of memory cards including semiconductor devices according to exemplary embodiments of the inventive concept.

Referring to FIG. 10, a memory card 1200 according to an embodiment may include, for example, a memory device 1210. The memory device 1210 may include, for example, at least one of the semiconductor devices according to embodiments mentioned above. In embodiments, the memory device 1210 may further include, for example, other types of semiconductor memory devices which are different from the semiconductor devices according to embodiments described above. The memory card 1200 may further include, for example, a memory controller 1220 that controls data communication between a host 1230 and the memory device 1210.

According to exemplary embodiments of the inventive concept, a semiconductor device having excellent reliability may be realized.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A semiconductor device comprising:

a first interlayer dielectric layer including a plurality of contacts;

a plurality of interconnection patterns disposed on the first interlayer dielectric layer, the interconnection patterns connected to the contacts, respectively; and a second interlayer dielectric layer disposed on the first interlayer dielectric layer and covering the interconnection patterns, wherein each of the interconnection patterns comprises:

a first metal pattern;

a second metal pattern disposed on the first metal pattern;

a first barrier pattern between the contact and the first metal pattern; and a second barrier pattern between the first metal pattern and the second metal pattern, wherein the second metal pattern exposes a portion of a top surface of the second barrier pattern; and wherein the second interlayer dielectric layer includes an air gap between the interconnection patterns adjacent to each other.

2. The semiconductor device of claim 1, wherein an edge portion of the second barrier pattern laterally protrudes from a sidewall of the second metal pattern, so that a sidewall of each of the interconnection patterns has a stepped profile.

3. The semiconductor device of claim 1, wherein a ratio of a sum of thicknesses of the first and second metal patterns to a thickness of the second barrier pattern is within a range of about 50:1 to about 700:1.

4. The semiconductor device of claim 1, wherein a thickness of the second barrier pattern is within a range of about 10 Å to about 100 Å.

5. The semiconductor device of claim 1, wherein the second barrier pattern is formed of a titanium-aluminum (Ti—Al) compound.

6. The semiconductor device of claim 1, wherein the air gap has a pipe-shape extending in parallel to the interconnection patterns.

7. The semiconductor device of claim 1, wherein a width of the air gap is within a range of about 60% to about 90% of a distance between bottom surfaces of the interconnection patterns adjacent to each other.

8. The semiconductor device of claim 1, wherein each of the interconnection patterns further includes an anti-reflecting pattern disposed on the second metal pattern.

9. A semiconductor device comprising:

a first interlayer dielectric layer including a plurality of contacts; and a plurality of interconnection patterns disposed on the first interlayer dielectric layer and connected to the contacts, respectively, wherein each of the interconnection patterns comprises:

a first metal pattern;

a second metal pattern disposed on the first metal pattern;

a first barrier pattern between the contact and the first metal pattern; and a second barrier pattern between the first metal pattern and the second metal pattern, wherein a sidewall of the first metal pattern has a smaller gradient than a gradient of a sidewall of the second metal pattern.

10. The semiconductor device of claim 9, further comprising:

a second interlayer dielectric layer disposed on the first interlayer dielectric layer and covering sidewalls and top surfaces of the interconnection patterns, wherein the second interlayer dielectric layer includes an air gap disposed between the interconnection patterns adjacent to each other.

11. The semiconductor device of claim 10, wherein the air gap has a pipe-shape extending in parallel to the interconnection patterns.

12. The semiconductor device of claim 10, wherein a width of the air gap is within a range of about 60% to about 90% of a distance between bottom surfaces of the interconnection patterns adjacent to each other.

13. The semiconductor device of claim 9, wherein an edge portion of the second barrier pattern laterally protrudes from a sidewall of the second metal pattern, so that a sidewall of each of the interconnection patterns has a stepped profile.

14. The semiconductor device of claim 9, wherein a ratio of a sum of thicknesses of the first and second metal patterns to a thickness of the second barrier pattern is within a range of about 50:1 to about 700:1.

15. The semiconductor device of claim 9, wherein the second barrier pattern is formed of a titanium-aluminum (Ti—Al) compound.

* * * * *